United States Patent [19]

Blank et al.

[11] Patent Number: 4,468,438

[45] Date of Patent: Aug. 28, 1984

[54] GARNET EPITAXIAL FILMS WITH HIGH CURIE TEMPERATURES

[75] Inventors: Stuart L. Blank, Madison; Virendra V. S. Rana, Berkeley Heights, both of N.J.

[73] Assignee: AT&T Bell Laboratories, Murray Hill, N.J.

[21] Appl. No.: 328,384

[22] Filed: Dec. 7, 1981

[51] Int. Cl.[3] .......................... B32B 9/04; G11C 19/08

[52] U.S. Cl. ...................................... 428/692; 365/33; 428/900

[58] Field of Search ........................ 428/692, 693, 900; 365/33

[56] References Cited

U.S. PATENT DOCUMENTS

| | | | |
|---|---|---|---|
| 3,964,035 | 6/1976 | Blank et al. | 365/33 |
| 4,001,793 | 1/1977 | Henry et al. | 428/693 |
| 4,002,803 | 1/1977 | Blank | 365/33 |
| 4,034,358 | 7/1977 | Blank | 365/33 |
| 4,139,905 | 2/1979 | Blank et al. | 365/33 |
| 4,337,521 | 6/1982 | Blank et al. | 428/692 |

*Primary Examiner*—William R. Dixon, Jr.
*Attorney, Agent, or Firm*—Bruce S. Schneider

[57] ABSTRACT

The use of vanadium on the tetrahedral site of a garnet material together with a suitable charge compensating ion, such as $Ca^{2+}$, results in advantageous materials. In particular, very high Curie temperatures, e.g., up to 524 degrees C., in films capable of supporting 1 μm-sized bubble domains, are observed. Additionally, the change of collapse field with temperatures for magnetic bubble domains in the garnet material is linear and closely parallels over a wide temperature range the change of bubble controlling static field of permanent magnets typically employed in magnetic bubble devices. A substantially constant bubble size is maintainable over a wide temperature range. The desired garnet compositions are produced advantageously from a melt containing a suitable ratio of vanadium to calcium.

3 Claims, No Drawings

GARNET EPITAXIAL FILMS WITH HIGH CURIE TEMPERATURES

BACKGROUND OF THE INVENTION

1. Field of the Invention

This invention relates to information storage devices and in particular to magnetic bubble devices.

2. Art Background

Extensive investigation has been applied to the preparation of information storage devices that depend on uniaxial single wall magnetic domains, i.e., magnetic bubble domains, for the storage of information. Typically, these devices include a garnet composition that is capable of supporting magnetic bubble domains through a magnetic anisotropy leading to an easy axis of magnetization perpendicular to the garnet surface. The uniaxial magnetic domains are typically produced, maintained, and propagated in the garnet material through the influence of magnetic fields. Among the fields employed is a static field that is introduced generally through the use of a barium ferrite permanent magnet which is part of the final device. This field maintains the uniaxial magnetic bubble domains once they are formed. The minimum and maximum strength of this static field necessary for such maintenance are called respectively the strip-in field and the collapse field. Both fields depend upon the magnetic moment per unit volume ($4\pi M_s$), the desired bubble size, and the thickness of the garnet layer (h).

A second magnetic field is employed to produce magnetic bubble domains and is introduced through the application of a current to a metal pattern that overlies the garnet layer. Once the magnetic bubble domains are produced, they are generally propagated through the garnet film by the use of magnetic fields induced by applying a rotating magnetic field to a permalloy pattern that overlies the garnet material or to a pattern produced through the ion implantation of a portion of the garnet material. (See T. J. Nelson, R. Wolfe, S. L. Blank, P. I. Bonyhard, W. A. Johnson, B. J. Roman, and G. P. Vella Coleiro, *Bell System Technical Journal*, Vol. 59, page 229 (1980) and A. J. Perneski, *IEEE Transactions On Magnetics, Mag*-5, 554 (1969) for a description of devices employing ion implantation and permalloy patterns, respectively.)

The properties of the device substantially depend on the intrinsic properties of the garnet layer. Intrinsic properties such as the magnetic moment, ($4\pi M_s$), the exchange constant (A), and the magnetic anisotropy ($K_u$) of a garnet film strongly influence the usable bubble size for a device employing this garnet. Preferably, usable $K_u$ should be substantially growth induced. Typically a stress induced anisotropy is produced by a lattice constant, $a_f$, mismatch between the garnet film and the substrate on which it is grown. However, the presence of strain is conducive to defect formation in the garnet film and is undesirable. Unacceptable strain is generally produced by a mismatch greater than 0.018 Å in compression and 0.013 Å in tension. (See S. L. Blank and J. W. Nielsen, *Journal of Crystal Growth,* Vol. 17, page 302 (1972). For thinner garnet layers, e.g., 1.0 μm in thickness, somewhat greater compressive mismatch, is acceptable.) Indeed, in the case of extreme tensile strain, a cracked film, which is definitely outside the limits of usefulness, is produced. Therefore, the strain induced component of the $K_u$ should be limited to that corresponding to acceptable mismatches.

The smaller the bubble size the greater the information that is storable within a unit area of the garnet material. For many applications, such as digital storage, the smaller the usable bubble, the more significant the device provided the bubble mobility in the garnet is reasonably high. Thus, it is desirable to have growth induced magnetic anisotropies, magnetic moments and exchange constants that together yield bubble sizes of 1 μm or less. (Bubble size is proportional to the material length parameter, l which is given by the expression $$l = \sqrt{\frac{AKu}{\pi M_s^2}}\ .)$$

Both the magnetic moment and magnetic anisotropy depend on temperature. Therefore, if a device is to undergo exposure to a wide range of temperatures, its usable bubble size might, depending on the degree of temperature dependence, change significantly during fluctuation in the ambient temperature. This possibility of property change becomes significant in applications at remote locations, such as space uses. Obviously, if the supportable bubble size changes significantly in an information storage device employed in these situations, the performance of the device will degrade substantially, and thus the possibility of failure is equally substantial.

It is also advantageous in situations involving elevated temperatures that a garnet composition employed in a device have a high Curie temperature. A Curie temperature, $T_c$, is the temperature at which the magnetic moment for all the magnetic sublattices (octahedral, tetrahedral and dodecahedral) of the garnet is zero. The magnetic properties of a garnet composition, e.g., $K_u$ and $4\pi M_s$, vary drastically at temperatures approaching the Curie temperature. Thus, for stable operations, a magnetic bubble device should be operated in environments having temperatures much below the Curie temperature of its garnet film. This is particularly true of devices that employ an ion implanted layer. The ion implantation in typical doses suppresses the Curie temperature as much as 70 degrees C. (See G. P. Vella Coleiro et al, *Journal of Applied Physics,* 52(3), 2355 (1981).) Thus, for a device relying on implantation in the garnet active layer, the operable temperature range for a given Curie temperature is even more restricted.

Additionally, ambient temperature fluctuations also affect the magnetic properties of the permanent magnet employed in the device to maintain the magnetic bubble domains. As the field of the permanent magnet decreases with increasing temperature, the field available to support magnetic bubble domains also decreases. Therefore, the device performance degrades significantly with increasing temperature, unless the field required to maintain a uniaxial magnetic bubble domain also decreases with temperature at about the same rate as the field of the bias magnet. (Similarly, if the collapse field of the garnet decreases too quickly relative to the magnetic field of the bias magnet, domains are not maintainable.)

Typical garnet films, e.g., $(YSmLuCa)_3(FeGe)_5O_{12}$, have desirable magnetic properties, i.e., a $Ku/2\pi M_s^2$ of greater than 2 corresponding to a capability of supporting a bubble size of 3 μm. However, although the material is desirable for a wide range of applications, its Curie temperature is relatively low—approximately 470 to 475 degrees K. Many attempts have been made to produce suitable garnet films depending on materials other than the typical $(YSmLuCa)_3(FeGe)_5O_{12}$ garnet films. (With respect to attempts involving vanadium containing films which were not suitable for device applications, see J. Daval, J. Geynet, and D. Challeton, *Conference on Magnetic Bubbles*, London, U.K. September 1973, for growth of extensively cracked films and see Yu. M. Yakovlev. V. S. Filonich, M. M. Klyuchnikov, and Yu. L. Sapozhnikov, *Soviet Physics Solid State*, 15(5), 1077 (1973) and V. S. Filonich, Yu. M. Yakovlev, and T. A. Devyatova, *Soviet Physics Solid State*, 16(3), 592 (1974) for growth of highly strained films having essentially no growth induced anisotropy.)

Attempts have also been made to produce a suitable garnet material that has a high Curie temperature and a $K_u$ that is substantially growth induced. For example, Obokata et al, (*IEEE Transactions on Magnetics, Mag*-9(3), 373 (1973)) have reported attempts to grow vanadium containing films with high Curie temperatures. However, these compositions were not visible for device applications. Obokata et al did not report a Curie temperature for their films and did report that the properties of their films were inadequate for device applications. In particular, Obokata described defective films with low mobilities (160 to 170 cm/sec/Oe), and with a substantially non-linear temperature dependence of the collapse field. Additionally, the magnetic properties of the Obokata film were not appropriate to support small, 1 μm diameter or less, bubble domains. Thus, although the desirability of a garnet composition with high Curie temperature is known, a composition having both high Curie temperature and the other properties desirable for use in a magnetic bubble device is not yet available.

SUMMARY OF THE INVENTION

Through the use of a particular vanadium containing garnet film, devices result that have the capability of supporting 1 μm and smaller bubbles, that have a high Curie temperature, e.g., up to 524 degrees K., that have properties suitable for device applications and that have a linear collapse field temperature dependence over a wide temperature range that is sufficiently close to that of a barium ferrite permanent magnet used in magnetic bubble devices so that device operation is not substantially affected over this relatively wide temperature range. These films also exhibit essentially zero change of bubble size over a wide range of temperatures, e.g., −50 to 150 degrees C. The garnet materials employed in the inventive devices have the general composition $\{RE_{3-x}Ca_x\}[M_{5-y}V_y]O_{12}$ where { } indicates the constituents on the dodecahedral site of the garnet, [ ] indicates the constituents on the tetrahedral and octahedral site of the garnet, M includes sufficient Fe to yield a magnetic moment, y is in the range 0.5 to 0.65, and x is sufficent to maintain the charge neutrality of the garnet by compensating for the presence of vanadium. (RE represents the occupants in the garnet dodecahedral site other than calcium and is typically a combination of rare earth ions. Yttrium for this purpose is considered a rare earth element.) These films are advantageously prepared by epitaxial growth from a melt containing a substantial excess of vanadium relative to its calcium content. The devices produced from the subject vanadium containing garnet films have high mobilities, e.g., mobilities up to 450 cm/sec/Oe, high Curie temperatures, above 510 degrees K., have a dynamic coercivity close to 1 Oersted, and have a $K_u$ that is essentially completely growth induced. The rate of change with temperature of the l parameter, $$\frac{1}{l}\frac{(dl)}{(dT)}$$

at 50 degrees C. is measured for these films to be from +0.03 to −0.06%/degree C. as compared to 0.14%/degree C. for standard films. The presence of vanadium also leads to a relatively large faraday rotation which improves bubble visibility.

DETAILED DESCRIPTION

An exemplary technique employed for growing the vanadium containing garnet films of the subject invention is the super-cooled melt, epitaxial growth method. This method has been extensively discussed in various articles. (See S. L. Blank and J. W. Nielsen, *Journal of Crystal Growth*, 17, 302 (1972) and E. A. Geiss, J. D. Kuptsis, and E. A. D. White, *Journal of Crystal Growth*, 6, 36 (1972) for a thorough discussion of the procedures used in this growth method.) Although the procedure for growing the garnet materials is conventional, the composition employed for the melt material needed to produce an appropriate level of vanadium in the epitaxial garnet layer is not conventional and is quite significant. To obtain garnet films with the desired composition, typically the melt should contain vanadium and calcium in a vanadium-to-calcium mole ratio above 2.0 (preferably above 2.60). Mole ratios below 2.0 yield grown garnet films with an excess of calcium relative to vanadium so that charge over-compensation by calcium and excessively low, below 10,000 ergs/cm$^3$, growth induced $K_u$ result. Additionally, ratios below 2.0 lead to unacceptable properties such as high magnetic moment and a low ratio of $$\frac{K_u}{2\pi M_s^2}.$$

Use of a mole ratio in the appropriate range yields garnet films with the desired composition $\{RE_{3-x}Ca_x\}[M_{5-y}V_y]O_{12}$ where { } represents the constituents in the garnet dodecahedral site, [ ] represents the constituents in the tetrahedral and octahedral sites, M includes sufficient Fe to produce a magnetic moment, and RE represents the constituents in the dodecahedral site other than Ca and typically includes rare earth ions. The precise vanadium-to-calcium mole ratio in the melt yielding a desired garnet composition is easily determined by using a control sample. Vanadium has very little tendency to be incorporated into the films in the absence of calcium as a charge compensating ions. Hence, sufficient amounts of calcium, for example in the form of calcium oxide, should be added to the melt to obtain the desired amount of vanadium in the film. (The amount of calcium incorporated in the film also to a lesser extent depends on growth temperature and growth rate. A control sample is used to determine a suitable temperature and rate for a desired amount of calcium and thus vanadium incorporation into the film.) Typically, the mole amount of calcium in the melt should be at least 8 times the total mole amount of rare earths present in the melt. (This amount of calcium relative to anisotropy producing component is different for anisotropy producing elements other than rare earth elements. In such a case, a controlled sample is employed to determine the best relative melt composition.) The mole ratio of vanadium to the flux component, e.g., lead, in the melt should also be controlled. A mole ratio of vanadium to flux component, e.g., lead, in the melt greater than 28 percent leads to formation of spurious vanadium containing compounds in the melt that are unacceptable. Additionally, in the situation where rare earth elements are employed, the molar ratio of $Fe_2O_3$ to the total rare earth oxide used in the melt should be greater than 20, preferably greater than 30. Lower $Fe_2O_3$ to rare earth oxide ratios lead to the formation of orthoferrite crystallites in the melt.

The melt is advantageously produced by mixing an oxide corresponding to each constituent part of the garnet. For example, vanadium oxide, iron oxide, and calcium oxide are employed. Two rare earth oxides, such as samarium oxide and lutetium oxide, are also typically employed to produce a suitable anisotropy. (The necessary rare earth materials for producing anisotropy are extensively discussed by E. M. Gyorgy, M. D. Sturge, L. G. Van Uitert, E. J. Heilner, and W. H. Grodkiewicz, *Journal of Applied Physics,* 44(1), 438 (1973).) It should be noted, however, in certain situations, rare earth elements need not be necessarily present in the garnet film provided other growth induced anisotropy producing ions are present. (See L. C. Luther, R. C. LeCraw, E. M. Gyorgy, and S. L. Blank, *Applied Physics Letters,* 36(9), 779 (1980) and U.S. application Ser. No. 106,399, filed Dec. 26, 1979, which is hereby incorporated by reference for a discussion of such non-rare earth anisotropy producing ions.) It is also advantageous that the anisotropy producing ions are introduced into the melt through their oxides. Additionally, other materials such as Si are introducible into the garnet material to adjust other properties such as lattice parameter. For example, silicon is introduced to adjust the lattice parameter of the garnet films to match that of a gadolinium-gallium garnet (GGG) wafer. In this manner, it is possible to grow a high-quality, relatively strain-free, vanadium containing film on a GGG wafer. Silicon, as other property adjusting elements, is advantageously introduced into the film by the addition of its oxide to the melt.

Typically to aid in the formation of the melt, a flux material, such as lead in the form of its oxide, is employed. The mole ratio of the flux to the other components of the melt should generally be in the range 3.00 to 3.75, preferably in the range of 3.30 to 3.50. (It is possible to substitute other flux materials such $Bi_2O_3$ for a portion of the PbO.) The melt is formed by combining the desired oxides at temperatures in the range 1000 to 1100 degrees C. until a homogeneous liquid phase is achieved. Before growth, the temperature of the melt is carefully lowered to a temperature in the range 860 to 900 degrees C. to produce super-cooling. (The addition of $Bi_2O_3$ to the flux reduces somewhat the growth temperature. For melts containing $Bi_2O_3$ temperature in the range 800 to 840 degrees C. are generally useful.)

To begin the epitaxial growth procedure, garnets are submerged in the melt material. These garnet substrates are typically gadolinium-gallium garnets (GGG). (A detailed description of the production of GGG wafer is found in C. D. Brandle and A. J. Valentino, *Journal of Crystal Growth,* 12, 3 (1972).) The substrates are typically maintained in the melt for a time period in the range 1 to 10 min so that an epitaxial layer thickness in the range 1.0 μm to 1.5 μm, preferably in the range 1.10 to 1.20 μm, is achieved. The substrates with their epitaxial layers are then removed from the melt. (A typical procedure for immersing the wafers in the melt is described in R. G. Warren, J. E. Mee, F. S. Stearns, and E. C. Whitcomb, *AIP Conference Proceedings,* 18, 63 (1974).)

The device is then prepared from the substrate with its garnet containing epitaxial layer. It is typically desirable that a dielectric material such as a silicon oxide is formed on the vanadium containing garnet layer. Usually, dielectric layers having thicknesses in the range 2000 to 4000 Å are employed. A uniaxial bubble domain control layer is then produced on the dielectric or if a dielectric is not employed, on the garnet layer. This control layer is produced typically by depositing a metal upon the dielectric material such as an aluminum-copper alloy. The aluminum-copper alloy is then patterned by conventional photolithographic and etching techniques to delineate structures suitable for bubble control functions such as nucleation, annihilation, replication, and transfer of bubbles. A second dielectric layer having a thickness in the range 2000 to 4000 Å is generally deposited upon the uniaxial magnetic bubble domain control layer.

A uniaxial magnetic bubble domain propagation expedient is also employed. This expedient is typically either a suitably patterned permalloy layer deposited on the second dielectric material or an ion implantation pattern of suitable ions, such as Ne, H, or He, formed in the garnet material before the first dielectric material is deposited. (See A. H. Bobeck, P. I. Bonyhard, and J. E. Geusic, *Proceedings Of The IEEE,* 63(8), 1176 (1975) for a description of the deposition of materials such as permalloy as the uniaxial magnetic domain propagation layer. See R. Wolfe, J. C. North, W. A. Johnson, R. R. Spiwak, L. J. Varnerin, and R. F. Fischer, *AIP Conference Proceedings,* 10, 339 (1972) for a description of an appropriate and typical ion implantation procedure for producing an ion implanted propagation control expedient.)

The following examples are illustrative of the subject invention.

EXAMPLE 1

A polished and cleaned <111> oriented GGG wafer that was 20 mils thick was placed in the sample holder of an epitaxial growth apparatus described in B. S. Hewitt, R. D. Pierce, S. L. Blank, and S. Knight, *IEEE Transactions On Magnetics, Mag*-9, No. 3, 366 (1973). A melt was formed by heating a combination of $Sm_2O_3$, $Lu_2O_3$, CaO, $Fe_2O_3$, $V_2O_5$, and PbO in a two and one-half inch diameter platinum crucible. The mole percentage of $Sm_2O_3$, $Lu_2O_3$, CaO, $Fe_2O_3$, $V_2O_5$, and PbO in the melt was respectively 0.05, 0.16, 6.30, 8.10, 8.39, and 77.00. The melt had a total weight of approximately 1915 gm. Approximately 0.55 gm of silicon oxide was added. The melt composition was heated to a temperature of approximately 1050 degrees C. The melt was maintained at this temperature overnight. The melt was stirred at 1050 degrees C. for approximately 3 hours, and was then cooled to 884 degrees C. Before the immersion was begun, a rotation of the wafer was initiated with a rotation reversal at 75 times per minute. (This continuous rotation and reversal was maintained throughout the growth and during the time when the wafer was withdrawn from the melt.) The wafer was immersed in the melt for a total time period of 2 minutes and 45 seconds. After removal from the melt, the melt adhering to the wafer was removed by spinning the wafer at a rate of approximately 600 rpm. The wafer was removed from the growth apparatus and lead oxide that was still adhering to the grown film was removed with a dilute solution of nitric acid. The thickness of the resulting garnet film was 1.15 μm. The other properties of the film as measured by standard techniques (see R. D. Pierce, *Journal of Crystal Growth,* 27, 229 (1974), R. C. LeCraw and R. D. Pierce, *AIP Conference Proceedings,* No. 5, 200 (1971), W. L. Bond, *Acta Crystal.* 13, 814 (1960), and G. P. Vella Coleiro, W. B. Venard, and R. Wolfe, *IEEE Transactions On Magnetics, Mag*-16, 625 (1980)) are shown in column 2 of Table 1.

TABLE 1

| | Column 1 | Column 2 |
|---|---|---|
| Growth T | 876° C. | 884° C. |
| Thickness | 1.15 μm | 1.15 μm |
| Stripe width | 1.00 μm | 1.06 μm |
| l | 0.104 μm | 0.115 μm |
| $H_o$ | 387 Oe | 370 Oe |
| $4\pi M$ | 690G | 685G |
| $\frac{Ku}{2\pi M_s^2} = Q$ | 2.1 | 2.3 |
| $T_c$ | 514° K. | 512° K. |
| $a_f$ | 12.3864 Å | 12.3839 Å |
| $\frac{1}{H_o}\left(\frac{\Delta H}{\Delta T}\right)$ at 50° C. | 0.265%/°C. | 0.275%/°C. |
| $H_c$ (Oe) | 1.0 Oe | 0.25 Oe |

EXAMPLE 2

The same procedure was followed as described in Example 1 except the growth temperature was 876 degrees C., the growth time was 2 min 55 sec, and the $SiO_2$ added to the melt was 0.45 gm. The properties of the resulting garnet films are shown in column 1 in Table 1.

What is claimed is:

1. A process for growing a garnet film on a substrate comprising the steps of immersing said substrate in a growth melt, growing said film on said substrate, and removing said substrate from said melt characterized in that said process includes the step of producing said growth melt by forming a molten composition containing calcium and vanadium such that the mole ratio of said vanadium to said calcium is above 2.0, wherein said garnet film comprises a composition represented by the formula $\{RE_{3-x}Ca_x\}[M_{5-y}V_y]O_{12}$ where y is in the range 0.50 to 0.65, where $0<x<3$ and wherein said composition is essentially neutral in charge.

2. The process of claim 1 wherein M includes silicon.

3. The device of claim 2 wherein M consists essentially of iron and silicon.

* * * * *